US007006395B2

(12) United States Patent
Ohno

(10) Patent No.: US 7,006,395 B2
(45) Date of Patent: Feb. 28, 2006

(54) SEMICONDUCTOR INTEGRATED CIRCUIT

(75) Inventor: Takashi Ohno, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 570 days.

(21) Appl. No.: 10/136,280

(22) Filed: May 2, 2002

(65) Prior Publication Data

US 2003/0097620 A1 May 22, 2003

(30) Foreign Application Priority Data

Nov. 20, 2001 (JP) ............................ 2001-354917

(51) Int. Cl.
*G11C 29/00* (2006.01)

(52) U.S. Cl. ....................... 365/201; 365/233; 365/194

(58) Field of Classification Search ................ 365/201, 365/233, 194
See application file for complete search history.

(56) References Cited

U.S. PATENT DOCUMENTS 5,629,895 A * 5/1997 Dosaka et al. ......... 365/189.01
6,011,728 A * 1/2000 Akeyama .................... 365/233
6,748,549 B1 * 6/2004 Chao et al. ................. 365/201

FOREIGN PATENT DOCUMENTS

JP 11317098 A 11/1999
JP 2001014894 A 1/2001

* cited by examiner

*Primary Examiner*—Huan Hoang

(74) *Attorney, Agent, or Firm*—Volentine Francos & Whitt, PLLC

(57) ABSTRACT

An semiconductor integrated circuit that uses a low-frequency operation clock to implement probing for fast operation. This semiconductor integrated circuit comprises a time adjustment circuit for adjusting the pulse width of enable signals. In normal mode, the time adjustment circuit does not convert the pulse width of enable signals. However, during probing, the time adjustment circuit converts an enable signal into an enable signal with a short pulse width for testing. In normal mode, a memory control circuit operates to synchronize with an unconverted enable signal. During probing, it operates in synchronization with an enable signal converted to one with a shorter pulse width.

13 Claims, 6 Drawing Sheets

SEMICONDUCTOR INTEGRATED CIRCUIT

BACKGROUND OF THE INVENTION

1. Field of the Invention

The present invention relates to an semiconductor integrated circuit, and more particularly, to an semiconductor integrated circuit with an operation testing function.

2. Description of Related Art

As is widely understood, in the manufacturing process of semiconductor memory device, firstly, many integrated memory circuits are formed on a semiconductor wafer, secondly, the operation of each integrated memory circuit are tested, moreover, the process of cutting the semiconductor wafer for memory chips, that is the dicing process is performed. Thereafter, only those memory chips deemed to be non-defective in the above operation test are packaged.

In a pre-dicing operation test, probes are pushed onto electrode pads on an integrated memory circuit. Input signals are supplied to the integrated memory circuit and output signals read from the integrated memory circuit via these probes. Therefore, this operation testing is called 'probing'.

It is preferable that the frequency of the operation clock used in probing be the same as the frequency of the operation clock used when a semiconductor memory device is actually used. This is because when these frequencies do not match, a memory chip deemed to operate normally in probing may not operate normally in actual use.

However, the operation characteristics of semiconductor integrated circuits are improving each year and currently memory device with operation clock frequencies exceeding 150 MHz are appearing. In contrast, it is difficult to improve the operating speed of testing apparatus and equipment used in probing because of there structures. Therefore, the limit for the frequency of operation clocks that can be used in probing is 30 MHz.

Accordingly, in conventional probing technology, it has been impossible to adequately increase the yield of semiconductor memory device.

SUMMARY OF THE INVENTION

An object of the present invention is to provide an semiconductor integrated circuit that can implement probing for fast operation using a low frequency operation clock.

To achieve this object, the semiconductor integrated circuit according to the present invention comprises: a signal generation circuit that generates a first enable signal which is synchronized with the period of an external clock; a time adjustment circuit that, in test mode, generates from the first enable signal a second enable signal with a pulse width that is shorter than that of the first enable signal and outputs the second enable signal, and that, in normal mode, outputs a second enable signal with a pulse width that is the same as that of the first enable signal; and a memory control circuit that uses the second enable signal to control a memory cell array.

In the present invention, "pulse width" means the length of time from when an enable signal becomes active level to when it returns to a non-active level.

In the present invention, "test mode" means the mode of implementing the operation test using a operation clock (i.e. the external clock) of low frequency. For example, the test mode is executed when the probing is implemented. In contrast, "Normal mode" uses a operation clock of high frequency (i.e. the normal frequency in the semiconductor integrated circuit). For example, normal mode is executed when the semiconductor device is actually used or during a post-packaging operation test.

BRIEF DESCRIPTION OF THE DRAWINGS

Other objects and advantages of the present invention will be explained with reference to the following drawings.

DESCRIPTION OF THE PREFERRED EMBODIMENTS

Figure 1:
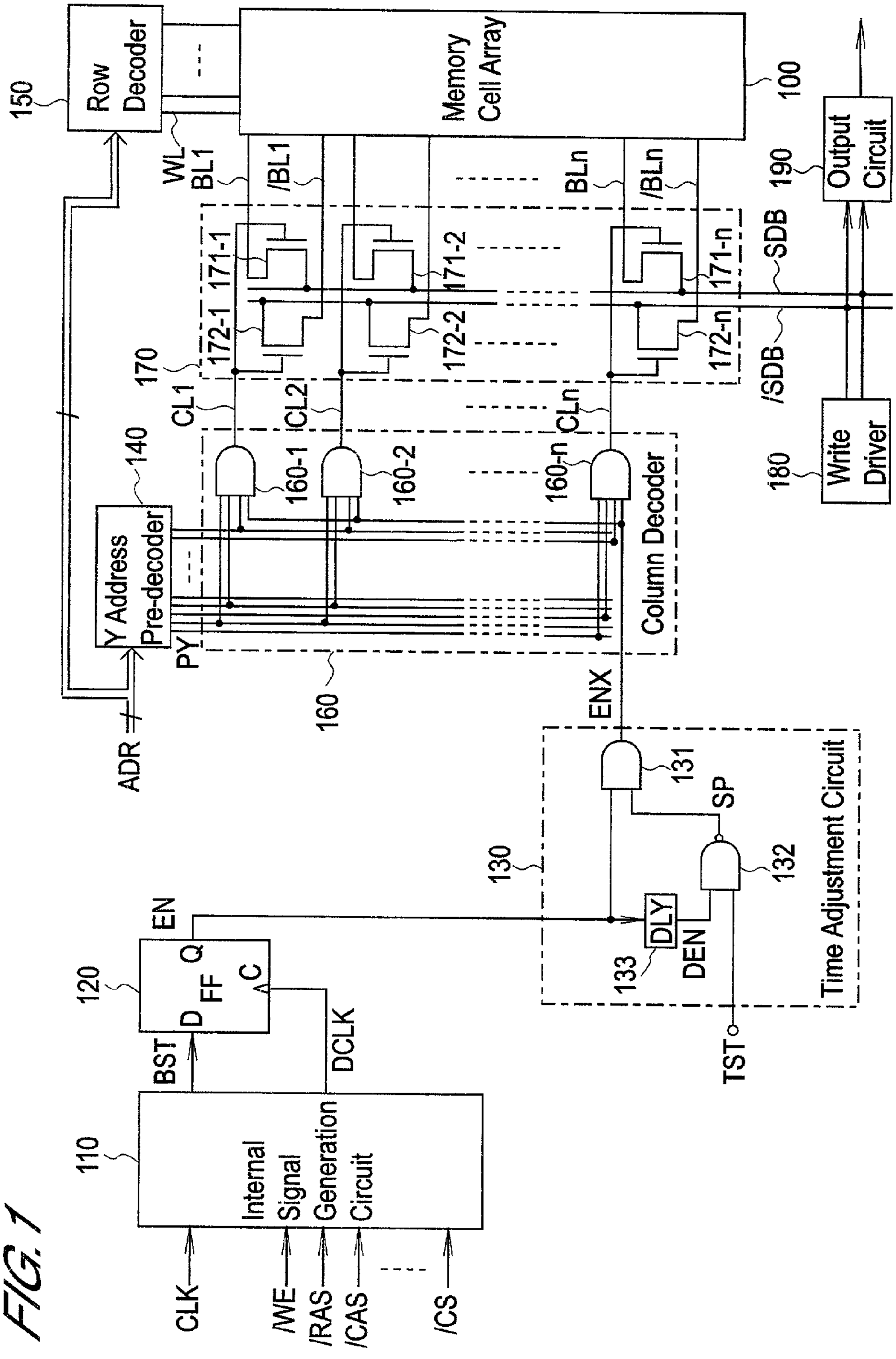
FIG. 1 is a circuit diagram of an semiconductor integrated circuit according to the first embodiment.

Aspects of the embodiment of the present invention will be explained below using the drawings. General sizes, shapes, and arrangements of all components in the drawings are provided merely to assist in an understanding of the invention and all numerical conditions explained below are examples only.

First Embodiment

FIG. 1 is a block diagram showing an overview of the configuration of an semiconductor integrated circuit according to the first embodiment.

As shown in FIG. 1, an semiconductor integrated circuit according to the present embodiment comprises: a memory cell array 100; an internal signal generation circuit 110; a flip flop 120; a time adjustment circuit 130; a Y address predecoder 140; a row decoder 150; a column decoder 160; a selector circuit 170; a write driver 180; and an output circuit 190.

The memory cell array 100 comprises a plurality of memory cells arranged in a matrix (not shown). Word lines WL1 through WLm are provided being corresponded to each memory cell column. Furthermore, bit line pairs BL1, /BL1 through BLn, /BLn are provided being corresponded to each memory cell row. The internal signal generation circuit 110 has input thereto a clock CLK, chip selection signal/CS, row address strobe signal/RAS, column address strobe signal/CAS, and write enable signal/WE from the outside. Using these input signals, the internal signal generation circuit 110 generates internal signals such as a delay clock DCLK and control signal BST. The delay clock DCLK is a signal that delays the clock CLK by a prescribed time. The control signal BST is a signal that controls the timing with which column lines CL1 through CLn are activated.

The flip flop 120 holds the control signal BST at the rise timing of the delay clock CLK and then outputs the control signal BST as an enable signal EN.

The time adjustment circuit 130 controls the pulse width of enable signal EN according as the value of test signal TST. The time adjustment circuit 130 comprises AND gate 131, NAND gate 132, and delay element 133. The NAND gate 132 has input thereto an enable signal EN via delay element 133 and a test signal TST from the outside via an electrode pad on the semiconductor chip. AND gate 131 has input thereto directly enable signal EN and the output signal of NAND gate 132.

Y address pre-decoder 140 pre-decodes an address signals input from address bus ADR. The Y address pre-decoder 140 outputs pre-decoded signals PY1 through PYj, which are obtained through this pre-decoding.

Row decoder 150 selects a word line, from word lines WL1 through WLm in memory cell array 100, that corresponds to an address signal input from address bus ADR. It then activates the selected word line.

Column decoder 160 converts pre-decoded signals PY1 through PYj into column signals CL1 through CLn. Column decoder 160 comprises multiple input AND gates 160-1 through 160-n. AND gates 160-1 through 160-n have input thereto enable signal ENX at one input terminal and some of pre-decode signals PY1 through PYj at other input terminals. AND gates 160-1 through 160-n are connected to corresponding column lines CL1 through CLn. One of AND gates 160-1 through 160-n is specified by pre-decode signals PY1 through PYj. The specified AND gate activates the corresponding column line when enable signal ENX is a high-level signal. The number of column signals is equal to the number of bit line pairs, that is n.

Selector circuit 170 selects bit line pairs, from BL1, /BL1 through BLn, /BLn, that correspond to activated column lines CL1 through CLn. This selection circuit 170 comprises switch transistor pairs 171-1, 172-1 through 171-n, 172-n, and sub-data-bus pair SDB, /SDB. Furthermore, selector circuit 170 is equipped with sense amps, not shown. Transistors 171-1 through 171-n and 172-1 through 172-n are n-channel MOS transistors. Transistors 171-1 through 171-n is connected to bit lines BL1 through BLn at one end via a sense amp, connected to the sub-data-bus SDB at the other end, and connected to column lines CL1 through CLn at a gate. Transistors 172-1 through 172-n is connected to bit lines /BL1 through /BLn at one end via a sense amp, connected to the sub-data-bus /SDB at the other end, and connected to column lines CL1 through CLn at a gate.

Write driver 180 outputs writing data for the memory cell array 100 to the sub-data-bus SDB.

Output circuit 190 has input thereto data read from memory cell array 100 from the sub-data-bus SDB and outputs it to the outside.

Figure 2:
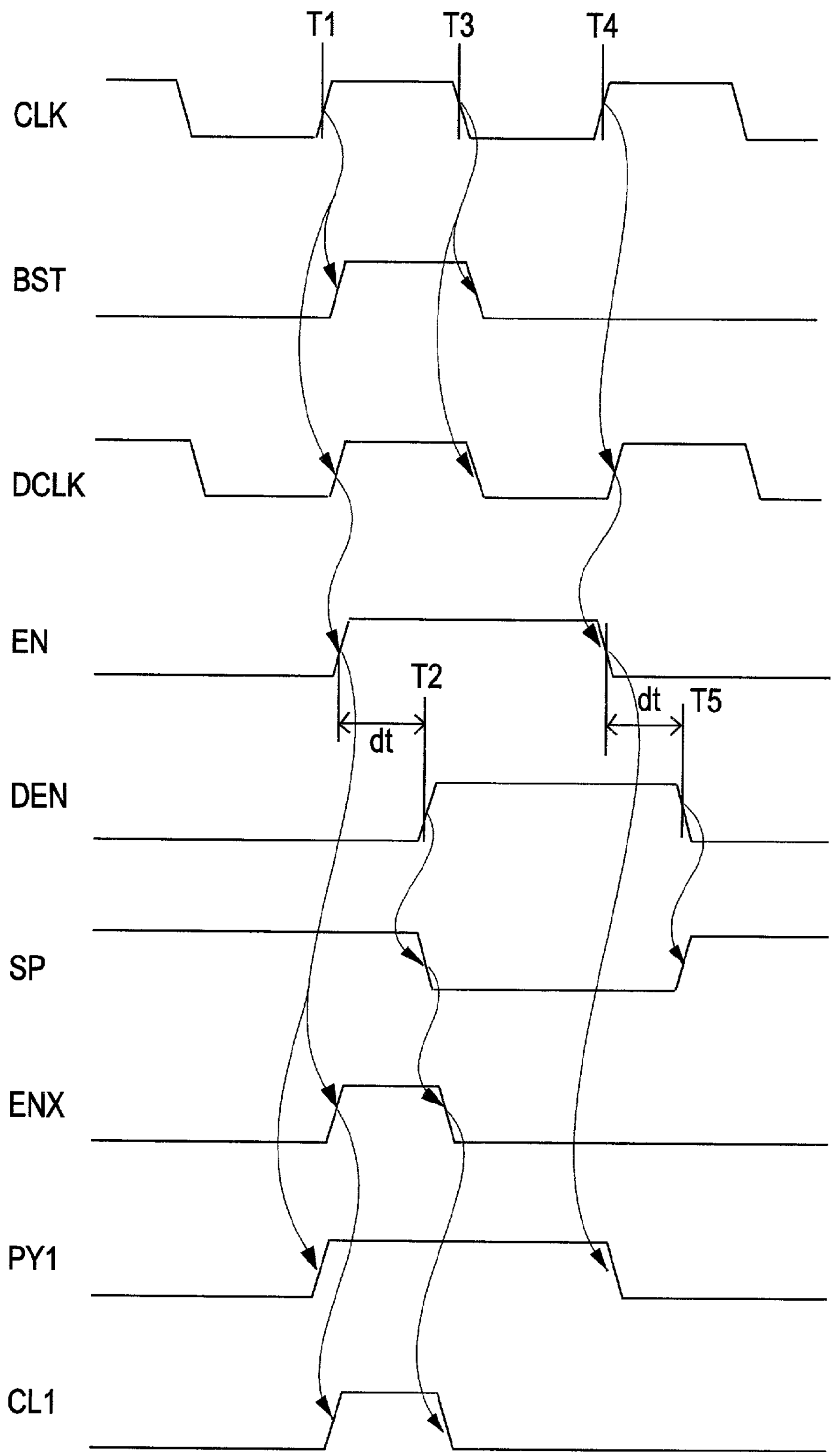
FIG. 2 is a timing chart for an semiconductor integrated circuit according to the first embodiment.

FIG. 2 is a timing chart that shows operations of the semiconductor integrated circuit shown in FIG. 1.

Firstly, operations during test mode, that is when probing is implemented, will be explained.

After integrated circuits are formed, a semiconductor wafer is set in test apparatus. The test apparatus forces probes into contact with prescribed electrode pads on each semiconductor circuit. Signals between the test apparatus and integrated circuits are input and output via the probes.

When probing is implemented, the electric potential of test signal TST is fixed at a high level and frequency of the clock CLK is, for example, 10 MHz. Other signals, such as /CS, /RAS, /CAS, or /WE signals, are supplied in synchronization with clock CLK.

The clock CLK rises at time T1. In the internal signal generation circuit 110, control signal BST rises to synchronize with the timing of the rise of clock CLK. Furthermore, delay clock DCLK in the internal signal generation circuit 110 rises after the prescribed time has passed since the rise of clock CLK. The flip flop 120 latches control signal BST when delay clock DCLK rises. Accordingly, enable signal EN, which is output from the flip flop 120, changes from a low-level to a high-level signal.

Immediately after enable signal EN becomes a high-level signal, output DEN of delay element 133 is low-level output. Accordingly, at this time, the output of NAND gate 132, that is control signal pattern SP, is high level. Therefore, the output of AND gate 131, that is enable signal ENX, changes from low level to high level as enable signal EN rises.

Also at time T1, address signal ADR is input into Y address pre-decoder 140. Y address pre-decoder 140 sets values for pre-decode signals PY1 through PYj in accordance with the value of address signal ADR. As a result, one of AND gates 160-1 through 160-n is specified. FIG. 2 shows a case in which AND gate 160-1 is specified. Specified AND gate 160-1 reacts to the rise of enable signal ENX and places column line CL1 on a high level. Here, other columns CL2 through CLn remain on a low level. This turns on transistor pair 171-1, 171-2 while other transistor pairs 171-2, 172-2 through 171-n, 172-n remain off. Accordingly, sub-data-bus SDB is connected to bit line BL1 and sub-data-bus /SDB is connected to bit line /BL1. Data is then written using write driver 180 or read using output circuit 190.

At time T2, output DEN of delay element 133 changes from low level to high level. That is, the time that passes between time T1 and time T2 is equivalent to the delay time of delay element 133. When output DEN of delay element 133 changes to high-level output, the control signal pattern SP of NAND gate 132 changes to a low-level. Accordingly, the output of AND gate 131, that is enable signal ENX, becomes low-level output. As a result, AND gate 160-1 places column line CL1 on a low level and accordingly, sub-data-buses SDB, /SDB and bit lines BL1, /BL1 become non-conductive.

At time T3, the clock CLK falls. Internal signal generation circuit 110 causes control signal BST to fall in synchronization with the fall of clock CLK. Furthermore, internal signal generation circuit 110 causes delay clock DCLK to fall after a prescribed amount of time has passed since clock CLK fell. However, flip flop 120 does not latch control signal BST when delay clock DCLK falls and accordingly, enable signal EN is maintained at a high level.

At time T4, clock CLK rises. At this time, internal signal generation circuit 110 does not cause control signal BST to rise. Internal signal generation circuit 110 causes delay clock DCLK to rise after the passage of a prescribed time after the rise of clock CLK. Flip flop 120 latches control signal BST when delay clock DCLK rises. This causes enable signal EN to move from being a high-level to being a low-level signal. When enable signal EN is a low-level signal, the output of AND gate 131, that is enable signal ENX, is maintained as a low-level. Accordingly, AND gate 160-1 maintains column signal CL1 at a low level. Therefore, transistor pair 171-1 and 172-1 are maintained off. Also, at time T4, Y address pre-decoder 140 stops output of pre-decode signals PY1 through PYj.

At time T5, output DEN of delay element 133 changes from high-level to low-level output. When output DEN of delay element 133 changes to low-level output, the output of NAND gate 132, that is control signal pattern SP, changes to high-level output. At this time, the output of AND gate 131, that is enable signal ENX, is maintained at a low level.

As described above, the pulse width of enable signal ENX is determined not by the period of clock CLK but to suit the delay time of delay element 133. Accordingly, by setting a short delay time it is possible to test operations at high speed.

Next, normal mode, that is the mode in which data is written to or read from completed semiconductor memory device, will be explained.

In this mode, the electric potential of test signal TST is fixed at a low level. Accordingly, the output of NAND gate 132 is high-level output regardless of the value of signal DEN output from delay element 133. Thus, the level of the output of AND gate 131, that is of enable signal ENX, is the same as the value of enable signal EN. Therefore, the column line specified by pre-code signals PY1 through PYj moves to a high level as delay clock DCLK first rises and to a low level when delay clock DCLK next rises. In other words, the time when a bit line pair is selected is determined by the period of delay clock DCLK.

As described above, the semiconductor integrated circuit according to the first embodiment is able to generate an enable signal ENX of shorter pulse width than the period of clock CLK when test signal TST is a high-level signal. Accordingly, high speed operation can be tested using a low frequency clock CLK.

Second Embodiment

Figure 3:
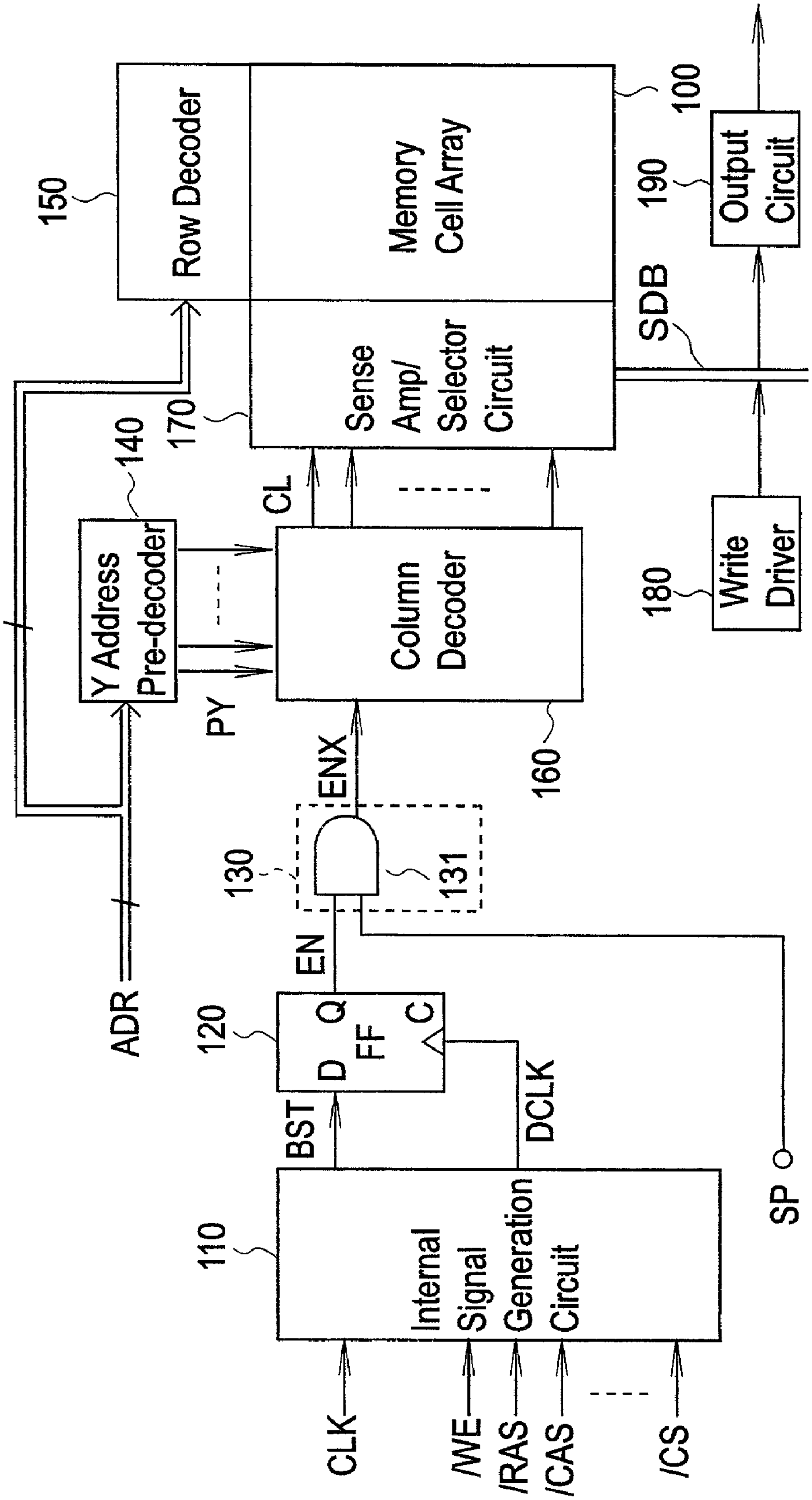
FIG. 3 is a circuit diagram of an semiconductor integrated circuit according to the second embodiment.

FIG. 3 is a block diagram that shows an overview of the configuration of an semiconductor integrated circuit according to the second embodiment. In FIG. 3, the symbols used in FIG. 1 are used to represent the same elements here.

In the first embodiment, control signal pattern SP is generated in time adjustment circuit 130. However, in this embodiment, control signal pattern SP is input from the outside.

The configuration of time adjustment circuit 130 in an semiconductor integrated circuit according to this embodiment is different from that of an semiconductor integrated circuit according to the first embodiment. As shown in FIG. 3, time adjustment circuit 130 in this embodiment has neither NAND gate 132 nor delay element 133. AND gate 131 outputs the logical product of enable signal EN and control signal pattern SP.

Control signal pattern SP is supplied from test apparatus via electrode pads. The signal SP pattern is the same as the output signal SP of NAND gate 132 in the first embodiment (refer to FIG. 2).

For the same reasons as in the first embodiment, the semiconductor integrated circuit according to this second embodiment can test high speed operation using a low frequency clock CLK.

In addition, the semiconductor integrated circuit according to this second embodiment has the advantage of being able to set the speed of probing operation to any value in the test apparatus.

Third Embodiment

The third embodiment will be explained using FIGS. 4 and 5.

In this embodiment, the configuration of time adjustment circuit 130 is different from that in each embodiment described above. FIG. 4 is a circuit diagram showing the configuration of time adjustment circuit 130 according to this embodiment.

Figure 4:
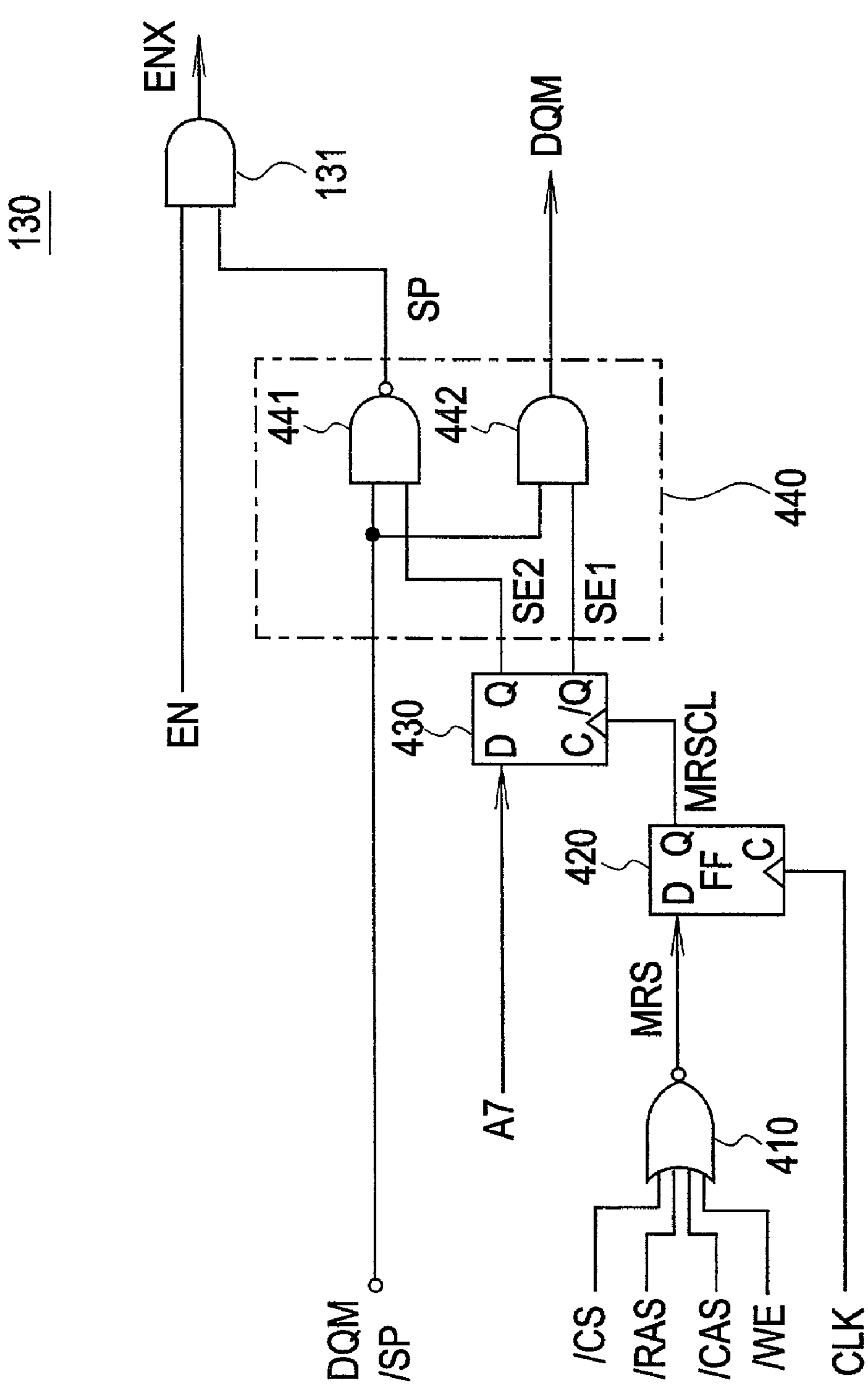
FIG. 4 is a circuit diagram of an semiconductor integrated circuit according to the third embodiment.

As shown in FIG. 4, time adjustment circuit 130 according to this embodiment comprises: NOR gate 410, flip flops 420 and 430, selector 440, and AND gate 131.

NOR gate 410 has input thereto chip selection signal/CS, row address strobe signal/RAS, column address strobe signal/CAS, and write enable signal/WE from test apparatus, and outputs the inverse value of the logical sum of these signals as signal MRS.

Flip flop 420 latches output signal MRS of NOR gate 410 when clock CLK rises. The latched signal MRS is output from flip flop 420 as signal MRSCL.

Flip flop 430 latches address signal A7 when signal MRSCL rises. Flip flop 430 outputs the inverse value of address signal A7 as signal SE1 and latched address signal A7 as signal SE2. Address signal A7 is the signal within address bus ADR (refer to FIG. 1).

Selector 440 comprises NAND gate 441 and AND gate 442. NAND gate 441 has input thereto signal SE2 at one input terminal and signal DQM/SP at the other input terminal. NAND gate 441 outputs the inverse value of the logical product of signals SE2 and DQM/SP as control signal pattern SP. AND gate 442 has input thereto signal SE1 at one input terminal and signal DQM/SP at the other input terminal and outputs the logical product of signals SE1 and DQM/SP as signal DQM. In this embodiment, signal DQM/SP is input from the electrode pad for inputting signal DQM. DQM is a signal used to control the input/output buffer (not illustrated). Here, the electrode pad for another signal can be used instead of the electrode pad for DQM.

AND gate 131 has input thereto enable signal EN at one input terminal and control signal pattern SP at the other input terminal. AND gate 131 outputs the logical product of these signals EN and SP as enable signal ENX. Similarly to the first embodiment, enable signal EN is output from flip flop 120 and enable signal ENX is input into column decoder 160 (refer to FIG. 1).

Ordinary semiconductor integrated circuits include a NOR gate 410 and flip flop 420 as a circuit for setting a mode register. A mode register is a register for setting an operation mode. The NOR gate 410 and flip flop 420 in this settings circuit can be used as part of a time adjustment circuit.

Figure 5:
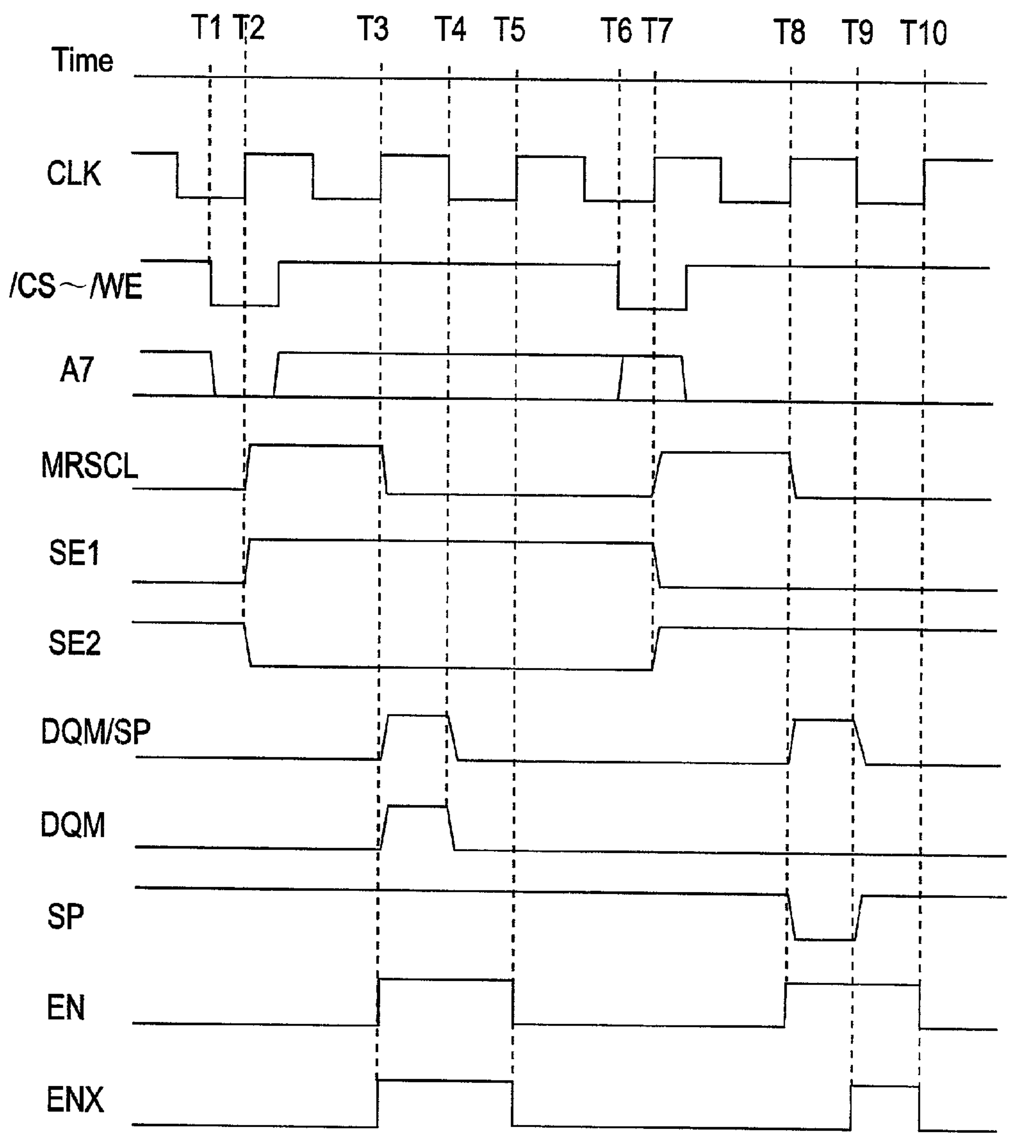
FIG. 5 is a timing chart for an semiconductor integrated circuit according to the third embodiment.

FIG. 5 is a timing chart for explaining the operation of the time adjustment circuit 130 shown in FIG. 4.

In an ordinary semiconductor integrated circuit, when the mode register is set, chip selection signal /CS, row address strobe signal /RAS, column address strobe signal /CAS, and write enable signal /WE are all low-level signals. In other words, when the mode register is set, these signals are all set as low-level signals. Then, when the clock CLK rises, a set mode register command is output from flip flop 420. In this embodiment, this command is also used as a probing command.

As will be explained below, in the time adjustment circuit 130 according to this embodiment, the size of the pulse width for enable signal ENX is switched by the signal level of address signal A7 when the set mode register command is output.

In normal mode, the electric potential of address signal A7 is set at a low level when the set mode register command is output. Operation in normal mode is explained below.

Firstly, at time T1, signals /CS, /RAS, /CAS, and /WE are all set as low-level signals. As a result, output signal MRS of NOR gate 410 becomes a high-level signal. In addition, at time T1, address signal A7 is set as a low-level signal.

At time T2, the clock CLK rises. This causes flip flop 420 to latch signal MRS. Accordingly, output signal MRSCL of flip flop 420 becomes a high-level signal. Flip flop 430 latches address signal A7 when signal MRSCL rises. This causes signal SE1 to become a high-level signal and signal SE2 to become a low-level signal. When signal SE1 is a high-level signal, the value of signal DQM/SP is output from AND gate 442, as is, as signal DQM. In addition, when signal SE2 is a low-level signal, the output of NAND gate 441, that is control signal pattern SP, is at a high level. Accordingly, when signal SE2 is a low-level signal, the value of enable signal EN is output from AND gate 131, as is, as enable signal ENX.

At time T3, signal DQM/SP rises in synchronization with the rise of clock CLK. Accordingly, the output signal DQM of AND gate 442 rises. In addition, immediately after time T3, flip flop 120 (refer to FIG. 1) causes enable signal EN to rise. Accordingly, enable signal ENX output from AND gate 131 rises. Also at this time, test apparatus supplies an address signal to address bus ADR. Furthermore, Y address pre-decoder 140, row decoder 150, column decoder 160, and selector circuit 170 (refer to FIG. 1) operate as in the first embodiment. This causes execution of write or read operations in memory cell array 100.

At time T4, signal DQM/SP falls in synchronization with the fall of clock CLK. This causes signal DQM to fall.

Immediately after time T5, flip flop 120 (refer to FIG. 1) causes enable signal EN to fall. This causes the enable signal ENX output from AND gate 131 to fall.

As explained above, when the signal level of address signal A7 at time T1 is low, the pulse width of enable signal EN matches that of enable signal ENX. In addition, in this case, signal DQM/SP is sent as signal DQM to an input-output buffer (not pictured). In normal mode, an semiconductor integrated circuit is operated using this method.

Operation in test mode will be next explained. In test mode, the electric potential of address signal A7 when a set mode register command is output is set at a high level.

Firstly, at time T6, signals /CS, /RAS, /CAS, and /WE are all set as low-level signals. As a result, the output signal MRS of NOR gate 410 becomes a high-level signal. In addition, at time T6, address signal A7 is set as a high-level signal.

At time T7, clock CLK rises. This causes flip flop 420 to latch signal MRS. Accordingly, output signal MRSCL of flip flop 420 becomes a high-level signal. Flip flop 430 latches address signal A7 as signal MRSCL rises. This causes signal SE1 to become a low-level signal and signal SE2 to become a high-level signal. When signal SE1 is a low-level signal, the output signal DQM of AND gate 442 is fixed at a low level. Also, when signal SE2 is a high-level signal, the output of NAND gate 441, that is control signal pattern SP, is the inverse value of signal DQM/SP.

At time T8, signal DQM/SP rises in synchronization with the rise of clock CLK. At this time, the output DQM of the AND gate 442 is maintained at a low level. Meanwhile, the output of AND gate 441, that is, the control signal pattern SP, becomes a low level. Immediately after time T8, flip flop 120 (refer to FIG. 1) causes enable signal EN to rise. Here, control signal pattern SP becomes low-level and therefore enable signal ENX is maintained as a low-level signal.

At time T9, signal DQM/SP falls in synchronization with the fall of clock CLK. This causes control signal pattern SP to become high-level. Accordingly, enable signal ENX becomes a high-level signal. As a result, column decoder 160 (refer to FIG. 1) operates as in the first embodiment and the operation of memory cell array 100 is tested.

Immediately after time T10, flip flop 120 (refer to FIG. 1) causes enable signal EN to fall. This causes enable signal ENX, which is output from AND gate 131, to fall.

As explained above, in the case when the signal level of address signal A7 at time T7 is high, the pulse width of enable signal ENX is shorter than that of enable signal EN. The difference in these pulse widths is approximately the same as the pulse width of signal DQM/SP. In this case, signal DQM/SP is used, not as signal DQM but as control signal pattern SP. During probing, this method is used to operate the semiconductor integrated circuit.

The semiconductor integrated circuit according to this embodiment does not require a dedicated electrode pad for the input of test signals. The test signal electrode pad can also be used, for example, as the DQM electrode pad. The electrode pad requires a much larger area than transistors within the integrated circuit. Accordingly, the area of an semiconductor integrated circuit can be reduced by removing the need for a test signal electrode pad.

Fourth Embodiment

Figure 6:
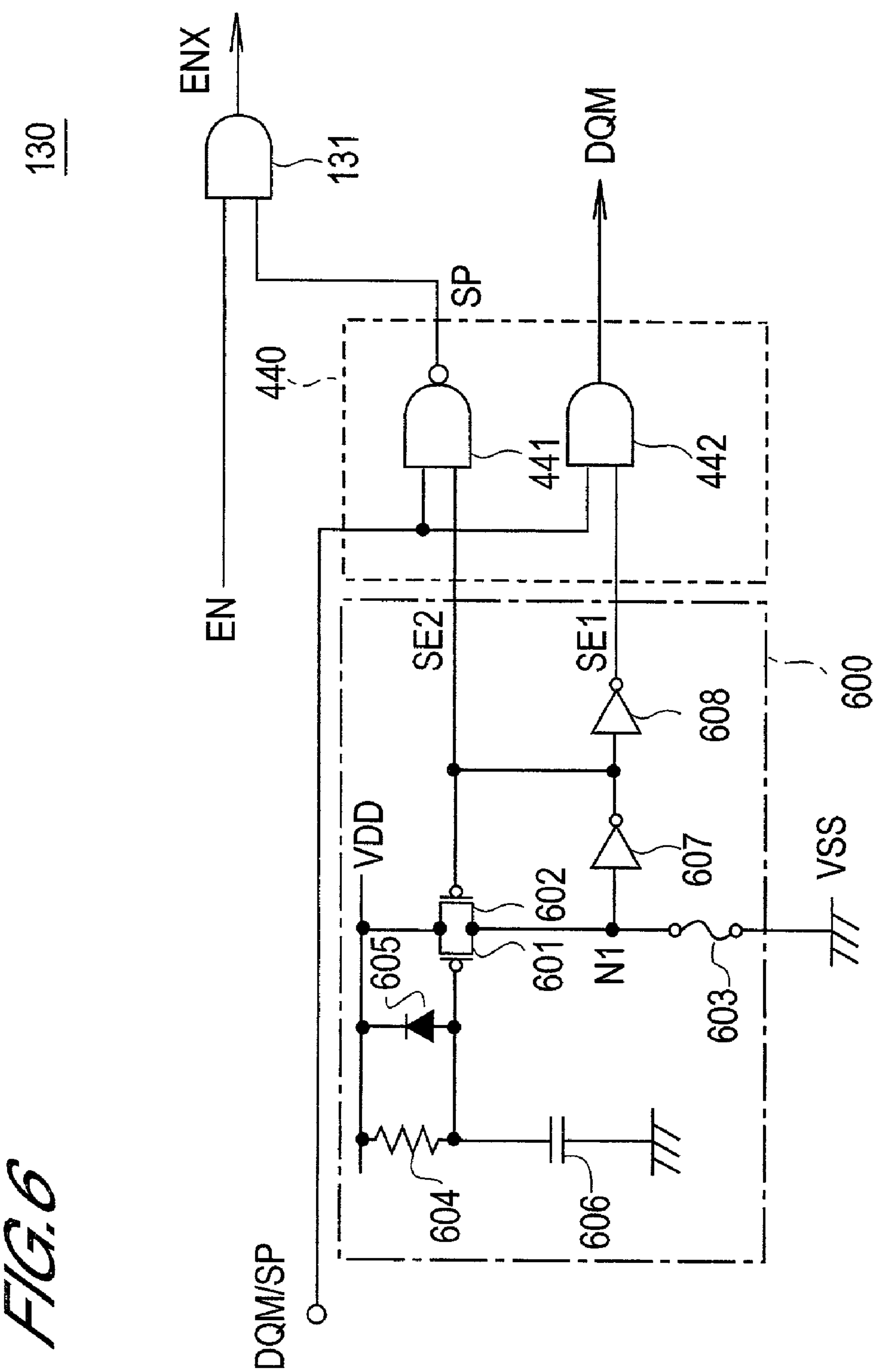
FIG. 6 is a circuit diagram of an semiconductor integrated circuit according to the forth embodiment.

FIG. 6 is a block diagram that provides an overview of the configuration of an semiconductor integrated circuit according to the fourth embodiment. In FIG. 6, the symbols used in FIG. 4 are used to represent the same elements here.

The configuration of the time adjustment circuit 130 in an semiconductor integrated circuit according to this embodiment is different from that in semiconductor integrated circuits according to each embodiment described above.

The time adjustment circuit 130 according to this embodiment comprises, in addition to selector 440 and AND gate 131, a circuit 600 for generating signals SE1 and SE2. This signal generation circuit 600 comprises p-channel MOS transistors 601 and 602, fuse 603, resistance 604, diode 605, capacitor 606, and inverters 607 and 608.

Transistor 601 and 602 are connected to power line VDD at the sources and connected to node N1 at the drains.

Fuse 603 is connected at one end to node N1 and at the other end to ground line VSS.

Resistor 604 is connected at one end to the gate of transistor 601 and connected at the other end to power line VDD.

Diode 605 is connected at the anode to the gate of transistor 601 and connected at the cathode to power line VDD.

Capacitor 606 is connected at one end to the gate of transistor 601 and connected at the other end to ground line Vss.

Inverter 607 is connected at the input terminal to node N1 and connected at the output terminal to the gate of transistor 602. The output of inverter 607 is supplied to selector 440 as signal SE2.

Inverter 608 is connected at the input terminal to the output terminal of inverter 607. The output of inverter 608 is supplied to selector 440 as signal SE1.

The operation of the time adjustment circuit 130 shown in FIG. 6 is explained below.

Test mode is executed in the situation of that fuse 603 is not disconnected. On the other hand, normal mode is executed in the situation that fuse 603 is disconnected.

Firstly, operation of an semiconductor integrated circuit in test mode will be explained.

As shown in FIG. 6, the gate of p-channel MOS transistor 601 is connected to ground line VSS via capacitor 606. Accordingly, before the electric potential of the power is applied to power line VDD, the gate of transistor 601 is zero volts. Therefore, transistor 601 is on. Then, when the power source is turned on, a current is supplied from power line VDD to node N1 via transistor 601. However, fuse 603 exists and so the current flows to ground line VSS. Accordingly, the electric potential of node N1 is at a low level. Therefore, output SE2 of inverter 607 is at a high level and output SE1 of inverter 608 is at a low level.

After that, the gate potential of transistor 601 rises to a high level as the capacitor 606 is charged, therefor the transistor 601 turns off. The output of inverter 607 is at a high level and so the off status of transistor 602 is maintained. Node N1 maintains a low level.

As a result, AND gate 441 outputs the inverse value of signal DQM/SP and AND gate 442 fixes output DQM at a low level.

Accordingly, as in the third embodiment, probing can be implemented (refer to T6 through T10 in FIG. 5).

Operation of an semiconductor integrated circuit in normal mode will be explained next.

When an integrated circuit is judged to be operating normally by the probing, fuse 603 is disconnected. The semiconductor memory device is then fabricated undergoing dicing and packaging.

Before power is applied to power line VDD in the fabricated semiconductor memory device, the gate of transistor 601 is at zero volts. Therefore, transistor 601 is on. When the power source is turned on, current is supplied from power line VDD to node N1 via transistor 601. Here, fuse 603 is disconnected and so the electric potential of node N1 becomes to high level. Therefore, output SE2 of inverter 607 becomes low-level and output SE1 of inverter 608 becomes high-level.

Because the output of inverter 607 is low level, the transistor 602 turns on. Moreover, the transistor 601 turns off because the gate potential of transistor 601 becomes high level.

As a result, the output of AND gate 441, that is the control signal pattern SP, is fixed at a high level and AND gate 442 outputs signal DQM/SP. Accordingly, the semiconductor memory device operates as in the third embodiment (refer to T1 through T5 in FIG. 5).

Diode 605 is used to quickly flow out the electric charge of capacitor 606 to power line VDD when the power source is off. By setting up diode 605, correct operation is guaranteed when the power is turned on again.

The semiconductor integrated circuit according to this embodiment does not require a dedicated electrode pad for the input of test signals. Accordingly, for the same reason as given in relation to the semiconductor integrated circuit according to the third embodiment, the area of the semiconductor integrated circuit can be reduced.

In addition, the semiconductor integrated circuit according to this embodiment can be smaller in scale than that according to the third embodiment.

The time adjustment circuit 130 is not restricted to the configurations shown in the first through fourth embodiments. The objects of the present invention can be achieved as long as the circuit is one that can shorten the enable signal EN during probing.

The objects of the present invention can be achieved even if circuits of different configurations are used as the column decoder 160 and selector circuit 170.

The electrode for input of test signals TST does not need to be connected to the lead frame at the packaging. However, when this electrode is connected to the lead frame, operation test in accordance with probing can be executed even after packaging.

What is claimed is:

1. A semiconductor integrated circuit comprising:

a signal generation circuit for generating a first enable signal in synchronization with a period of an external clock;

a time adjustment circuit that generates a second enable signal from the first enable signal wherein a pulse width of the second enable signal is shorter than a pulse width of the first enable signal during a test mode and the pulse width of the second enable signal is the same as the pulse width of the first enable signal during a normal mode, and outputs the second enable signal; and a memory control circuit that uses the second enable signal to control a memory cell array, wherein said time adjustment circuit comprises a first logical gate that outputs the second enable signal at the same signal level as the first enable signal when a control signal pattern is at an active level, and that forcibly makes the second enable signal a non-active level when the control signal pattern is non-active, and wherein the control signal pattern is input directly from the outside via an electrode pad.

2. The semiconductor integrated circuit according to claim 1, wherein said first logical gate is an AND gate.

3. A semiconductor integrated circuit comprising:

a signal generation circuit for generating a first enable signal in synchronization with a period of an external clock;

a time adjustment circuit that generates a second enable signal from the first enable signal wherein a pulse width of the second enable signal is shorter than a pulse width of the first enable signal during a test mode and the pulse width of the second enable signal is the same as the pulse width of the first enable signal during a normal mode, and outputs the second enable signal; and a memory control circuit that uses the second enable signal to control a memory cell array, wherein said time adjustment circuit comprises a first logical gate that outputs the second enable signal at the same signal level as the first enable signal when a control signal pattern is at an active level, and that forcibly makes the second enable signal a non-active level when the control signal pattern is non-active, and wherein said control signal pattern is generated from a chip control signal for controlling other circuits in said normal mode, wherein said time adjustment circuit has a selector comprising a second logical gate that in said test mode outputs an inverse value of said chip control signal as the control signal pattern, and that in said normal mode outputs the control signal pattern as fixed at an active level, and a third logical gate that in said test mode fixes an output level thereof at a non-active level, and that in said normal mode changes the output level thereof to suit a signal level of said chip control signal.

4. The semiconductor integrated circuit according to claim 3, wherein said second logical gate is a NAND gate and said third logical gate is an AND gate.

5. The semiconductor integrated circuit according to claim 3, comprising a selector signal generation circuit for generating a selector signal for said selector using one or a plurality of types of external input signals not including the chip control signal.

6. The semiconductor integrated circuit according to claim 5, wherein said selector signal generation circuit comprises:

a first data flip flop that has input thereto a first external input signal and outputs both the selector signal and an inverse selector signal;

a fourth logical gate that has input thereto a plurality of types of second external input signals not including said first external input signal; and a second data flip flop, the input terminal of which is connected to an output terminal of said fourth logical gate, an output terminal of which is connected to a clock input terminal of said first data flip flop, and that has input thereto an external clock at a clock input terminal.

7. The semiconductor integrated circuit according to claim 6, wherein said fourth logical gate is a NOR gate.

8. The semiconductor integrated circuit according to claim 6, wherein said first external input signal is an address signal.

9. The semiconductor integrated circuit according to claim 6, wherein said second external input signals include any of a chip selector signal, a row address strobe signal, a column address strobe signal, and a write enable signal.

10. The semiconductor integrated circuit according to claim 3, comprising a selector signal generation circuit that generates a selector signal for said selector and that switches the selector signal according to connection and disconnection of a fuse.

11. The semiconductor integrated circuit according to claim 10, wherein said selector signal generation circuit comprises:

a first inverter having an input terminal which is connected to a ground line via said fuse, and that outputs the selector signal from an output terminal thereof;

a second inverter that has an input terminal at which an output signal of said first inverter is input thereto, and that outputs an inverted selector signal from an output terminal thereof; and a transistor circuit that supplies power supply potential to the input terminal of said first inverter.

12. The semiconductor integrated circuit according to claim 11, wherein said transistor circuit comprises:

a first transistor, one end of which is connected to a power line and an other end of which is connected to the input terminal of said first inverter;

a second transistor, one end of which is connected to said power line, an other end of which is connected to the input terminal of said first inverter, and a control terminal of which is connected to the output terminal of said first inverter;

a resistance element, one end of which is connected to said power line and an other end of which is connected to a control terminal of said first transistor; and a capacitor, one end of which is connected to said ground line and an other end of which is connected to the control terminal of said first transistor.

13. The semiconductor integrated circuit according to claim 12, further comprising a diode, a cathode of which is connected to said power line and an anode of which is connected to the other end of said capacitor.

* * * * *